(12) United States Patent
Kim et al.

(10) Patent No.: US 12,506,010 B2
(45) Date of Patent: Dec. 23, 2025

(54) WET ETCHING METHOD AND METHOD OF FABRICATING SEMICONDUCTOR DEVICE BY USING THE SAME

(71) Applicant: Samsung Electronics Co., Ltd., Suwon-si (KR)

(72) Inventors: Taeheon Kim, Busan (KR); Kyunghyun Kim, Seoul (KR); Changsup Mun, Hwaseong-si (KR); Junyoul Yang, Seoul (KR); Sanghoon Jeong, Suwon-si (KR); Yongsik Chung, Hwaseong-si (KR); Seungcheol Chae, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 598 days.

(21) Appl. No.: 18/095,798

(22) Filed: Jan. 11, 2023

(65) Prior Publication Data

US 2023/0230843 A1 Jul. 20, 2023

(30) Foreign Application Priority Data

Jan. 14, 2022 (KR) .................. 10-2022-0006175

(51) Int. Cl.
*H01L 21/311* (2006.01)
*H10D 30/01* (2025.01)
(Continued)

(52) U.S. Cl.
CPC ...... *H01L 21/31111* (2013.01); *H10D 30/025* (2025.01); *H01L 24/32* (2013.01);
(Continued)

(58) Field of Classification Search
CPC ................................................ H01L 21/31111
See application file for complete search history.

(56) References Cited

U.S. PATENT DOCUMENTS 6,001,215 A 12/1999 Ban
10,325,779 B2 6/2019 Rotondaro et al.
(Continued)

FOREIGN PATENT DOCUMENTS

CN 107946213 B 3/2020
CN 109216367 B 7/2021
(Continued)

OTHER PUBLICATIONS

Korean NOA dated Aug. 28, 2022 for corresponding application KR10-2022-0006175.
(Continued)

*Primary Examiner* — Yu-Hsi D Sun
(74) *Attorney, Agent, or Firm* — Muir Patent Law, PLLC

(57) ABSTRACT

A wet etching method includes: providing a structure including an etching target film into a process bath containing a first etching solution having a first phosphoric acid concentration; performing a first etching process for etching the etching target film with the first etching solution in the process bath; providing a second etching solution having a second phosphoric acid concentration different from the first phosphoric acid concentration by changing a phosphoric acid concentration in the first etching solution; performing a second etching process for etching the etching target film with the second etching solution in the process bath; providing a third etching solution having a third phosphoric acid concentration different from the first and second phosphoric acid concentrations by changing a phosphoric acid concentration in the second etching solution; and performing a third etching process for etching the etching target film with the third etching solution in the process bath.

20 Claims, 15 Drawing Sheets

(51) Int. Cl.
*H01L 23/00* (2006.01)
*H10B 80/00* (2023.01)

(52) U.S. Cl.
CPC .............. *H01L 24/48* (2013.01); *H01L 24/73* (2013.01); *H01L 2224/32145* (2013.01); *H01L 2224/32225* (2013.01); *H01L 2224/48145* (2013.01); *H01L 2224/48227* (2013.01); *H01L 2224/73265* (2013.01); *H10B 80/00* (2023.02)

(56) References Cited

U.S. PATENT DOCUMENTS

| | | | |
|---|---|---|---|
| 10,651,061 | B2 | 5/2020 | Ohno et al. |
| 10,886,290 | B2 | 1/2021 | Bassett et al. |
| 10,910,237 | B2 | 2/2021 | Jeong et al. |
| 11,087,992 | B2 | 8/2021 | Hirayama et al. |
| 11,101,279 | B2 | 8/2021 | Komiya et al. |
| 2012/0248061 | A1 | 10/2012 | Brown et al. |
| 2021/0066077 | A1 | 3/2021 | Bang et al. |
| 2022/0037324 | A1* | 2/2022 | Lee .................. H01L 21/31116 |

FOREIGN PATENT DOCUMENTS

| | | |
|---|---|---|
| JP | 2020141063 A | 9/2020 |
| KR | 101391605 B1 | 5/2014 |
| KR | 101730453 B1 | 4/2017 |
| KR | 1020190029471 A | 3/2019 |
| KR | 1020190044008 A | 4/2019 |
| KR | 1020200062327 A | 6/2020 |
| KR | 102172305 B1 | 10/2020 |
| KR | 102311324 B1 | 10/2021 |

OTHER PUBLICATIONS

KR Office Action dated Apr. 26, 2022 for corresponding KR Application KR10-2022-0006175.

* cited by examiner

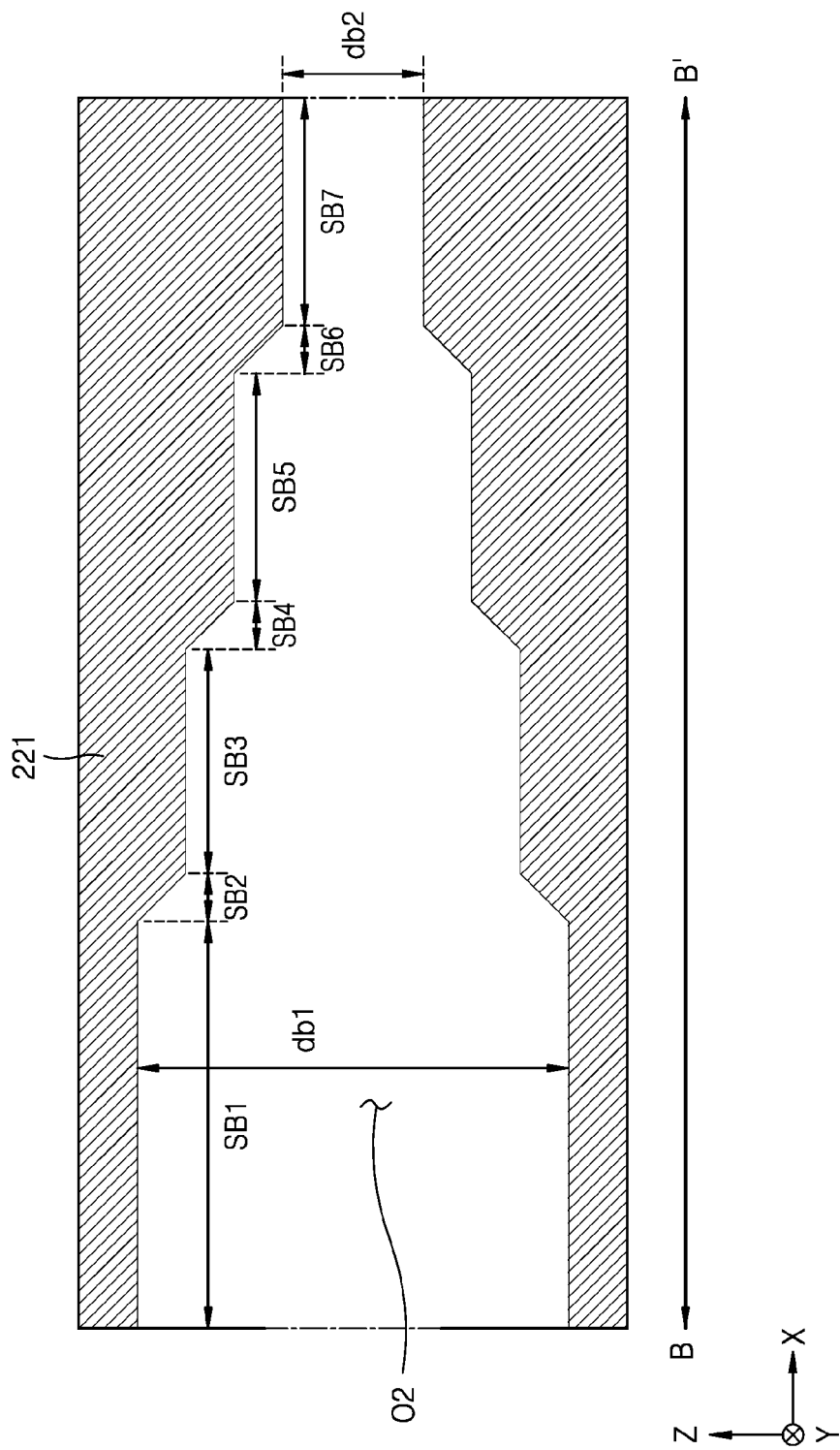

WET ETCHING METHOD AND METHOD OF FABRICATING SEMICONDUCTOR DEVICE BY USING THE SAME

CROSS-REFERENCE TO RELATED APPLICATION

This application is based on and claims priority under 35 U.S.C. § 119 to Korean Patent Application No. 10-2022-0006175, filed on Jan. 14, 2022, in the Korean Intellectual Property Office, the disclosure of which is incorporated by reference herein in its entirety.

BACKGROUND

The inventive concept relates to a wet etching method and a method of fabricating a semiconductor device by using the wet etching method. More particularly, the inventive concept relates to a wet etching method using a phosphoric acid solution and a method of fabricating a semiconductor device by using the wet etching method.

According to the advancement of the electronics industry and the demand of consumers, it is required to increase the degree of integration of semiconductor devices. Therefore, 3-dimensional semiconductor memory devices including 3-dimensionally arranged memory cells have been proposed. In fabricating 3-dimensional semiconductor memory devices, wet etching processes may be performed to remove sacrificial films stacked on substrates.

SUMMARY

The inventive concept provides a wet etching method capable of improving the reliability of a semiconductor device and the productivity of semiconductor device fabrication.

The inventive concept also provides a method of fabricating a semiconductor device, the method being capable of improving the reliability of a semiconductor device and the productivity of semiconductor device fabrication.

According to an aspect of the inventive concept, there is provided a wet etching method including: providing a structure including an etching target film into a process bath containing a first etching solution that has a first phosphoric acid concentration; performing a first etching process for etching the etching target film by using the first etching solution in the process bath; providing a second etching solution having a second phosphoric acid concentration, which is different from the first phosphoric acid concentration, by changing a phosphoric acid concentration in the first etching solution; performing a second etching process for etching the etching target film by using the second etching solution in the process bath; providing a third etching solution having a third phosphoric acid concentration, which is different from the first phosphoric acid concentration and the second phosphoric acid concentration, by changing a phosphoric acid concentration in the second etching solution; and performing a third etching process for etching the etching target film by using the third etching solution in the process bath.

According to another aspect of the inventive concept, there is provided a method of fabricating a semiconductor device, the method including: forming a structure, in which a plurality of insulating films and a plurality of sacrificial films are alternately stacked one-by-one on a substrate; forming a channel hole, which passes through the plurality of insulating films and the plurality of sacrificial films in a vertical direction; forming a vertical channel structure in the channel hole; forming a plurality of first openings, which pass through the plurality of insulating films and the plurality of sacrificial films in the vertical direction; forming a plurality of second openings by removing the plurality of sacrificial films through each first opening; and forming a plurality of gate electrodes in the plurality of second openings, respectively, wherein the forming of the plurality of second openings by removing the plurality of sacrificial films includes: providing the structure into a process bath containing a first etching solution that has a first phosphoric acid concentration; performing a first etching process for etching the plurality of sacrificial films by using the first etching solution in the process bath; providing a second etching solution having a second phosphoric acid concentration, which is different from the first phosphoric acid concentration, by changing a phosphoric acid concentration in the first etching solution; performing a second etching process for etching the plurality of sacrificial films by using the second etching solution in the process bath; providing a third etching solution having a third phosphoric acid concentration, which is different from the first phosphoric acid concentration and the second phosphoric acid concentration, by changing a phosphoric acid concentration in the second etching solution; and performing a third etching process for etching the plurality of sacrificial films by using the third etching solution in the process bath.

According to yet another aspect of the inventive concept, there is provided a wet etching method including: providing a structure including an oxide film and a nitride film into a process bath containing a first etching solution, which includes water and phosphoric acid and has a first phosphoric acid concentration; performing a pre-etching process for etching the oxide film and the nitride film by using the first etching solution; providing a second etching solution having a second phosphoric acid concentration, which is different from the first phosphoric acid concentration, by reducing a phosphoric acid concentration in the first etching solution; performing a first main etching process for etching the oxide film and the nitride film by using the second etching solution; providing a third etching solution having a third phosphoric acid concentration, which is different from the first phosphoric acid concentration and the second phosphoric acid concentration, by reducing a phosphoric acid concentration in the second etching solution; performing a second main etching process for etching the oxide film and the nitride film by using the third etching solution; providing a fourth etching solution having a fourth phosphoric acid concentration, which is different from the first phosphoric acid concentration, the second phosphoric acid concentration, and the third phosphoric acid concentration, by reducing a phosphoric acid concentration in the third etching solution; and performing a post-etching process for etching the oxide film and the nitride film by using the fourth etching solution.

BRIEF DESCRIPTION OF THE DRAWINGS

Embodiments of the inventive concept will be more clearly understood from the following detailed description taken in conjunction with the accompanying drawings in which:

FIGS. 6A and 6B are cross-sectional views taken along a line B-B' of FIG. 5 on an X-Z plane;

DETAILED DESCRIPTION OF THE EMBODIMENTS

Figure 1:
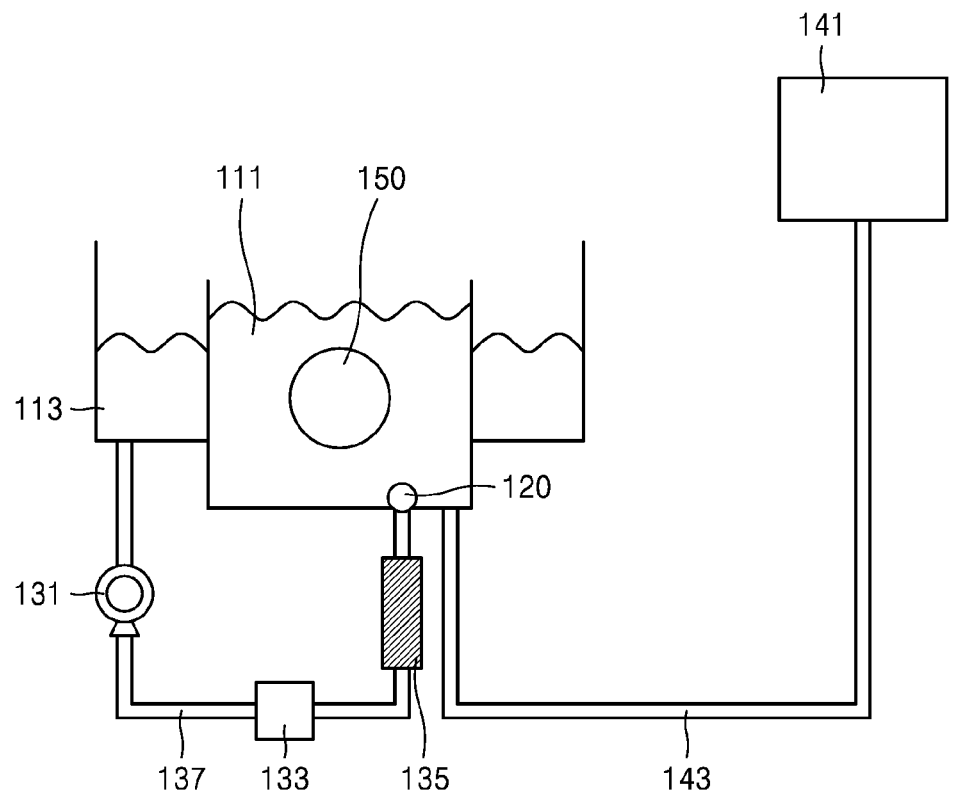
FIG. 1 is a cross-sectional view illustrating a wet etching apparatus according to an example embodiment of the inventive concept.

Hereinafter, embodiments of the inventive concept will be described in detail with reference to the accompanying drawings. Like components are denoted by like reference numerals throughout the specification, and repeated descriptions thereof are omitted.

Hereinafter, unless otherwise stated, a direction parallel to an upper surface of a substrate 210 (see FIG. 4A) is defined as a first horizontal direction (X direction), a direction perpendicular to the upper surface of the substrate 210 is a vertical direction (Z direction), and a direction perpendicular to each of the first horizontal direction (X direction) and the vertical direction (Z direction) is a second horizontal direction (Y direction).

FIG. 1 is a cross-sectional view illustrating a wet etching apparatus 100 according to an example embodiment of the inventive concept.

Referring to FIG. 1, the wet etching apparatus 100 may include a process bath 111, an external bath 113, a solution nozzle 120, a circulation pump 131, a filter 133, a heater 135, a circulation line 137, a water-supply device 141, and a water-supply line 143.

The process bath 111 may contain an etching solution therein. A wafer 150 including a structure, in which insulating films and sacrificial films are alternately stacked, is provided into the process bath 111, in which the etching solution is contained, and an etching process for removing the sacrificial films of the wafer 150 may be performed. The external bath 113 may be arranged outside the process bath 111 to surround the process bath 111. As an etching process is performed, the etching solution may overflow from the process bath 111 and move to the external bath 113. The process bath 111 and the external bath 113 may each include a material having chemical and physical resistance with respect to the etching solution. For example, the process bath 111 and the external bath 113 may each include quartz.

The solution nozzle 120 may be attached to the process bath 111. The etching solution may move from the external bath 113 to the process bath 111 through the solution nozzle 120. The solution nozzle 120 may adjust a flow rate of the etching solution moving from the external bath 113 to the process bath 111.

The circulation line 137 may be connected to the external bath 113 and the solution nozzle 120 attached to the process bath 111. The circulation pump 131, the filter 133, and the heater 135 may be arranged on the circulation line 137 along the circulation line 137. Although FIG. 1 illustrates that one circulation pump 131, one filter 133, and one heater 135 are arranged on the circulation line 137, the inventive concept is not limited thereto. For example, a plurality of circulation pumps 131 may be respectively arranged at various positions on the circulation line 137. The etching solution contained in the external bath 113 may be circulated into the process bath 111 through the circulation pump 131, the filter 133, and the heater 135 along the circulation line 137.

The circulation pump 131 may be arranged between the external bath 113 and the filter 133 along the circulation line 137. The circulation pump 131 may supply the etching solution contained in the external bath 113 to the process bath 111 through the filter 133 and the heater 135.

The filter 133 may be arranged between the circulation pump 131 and the heater 135 along the circulation line 137. The filter 133 may filter out impurities of the etching solution circulating from the external bath 113 into the process bath 111.

The heater 135 may be arranged between the filter 133 and the process bath 111 along the circulation line 137. The heater 135 may include, for example, an electric heating device. The heater 135 may maintain a temperature of the etching solution, which circulates from the external bath 113 into the process bath 111, within a temperature range of an etching process.

The water-supply device 141 may be connected to the process bath 111 through the water-supply line 143. The water-supply device 141 may supply, for example, water, such as deionized (DI) water, into the process bath 111. The water-supply device 141 supplies water into the process bath 111, and thus, a phosphoric acid concentration in the etching solution contained in the process bath 111 may be adjusted.

Figure 2:
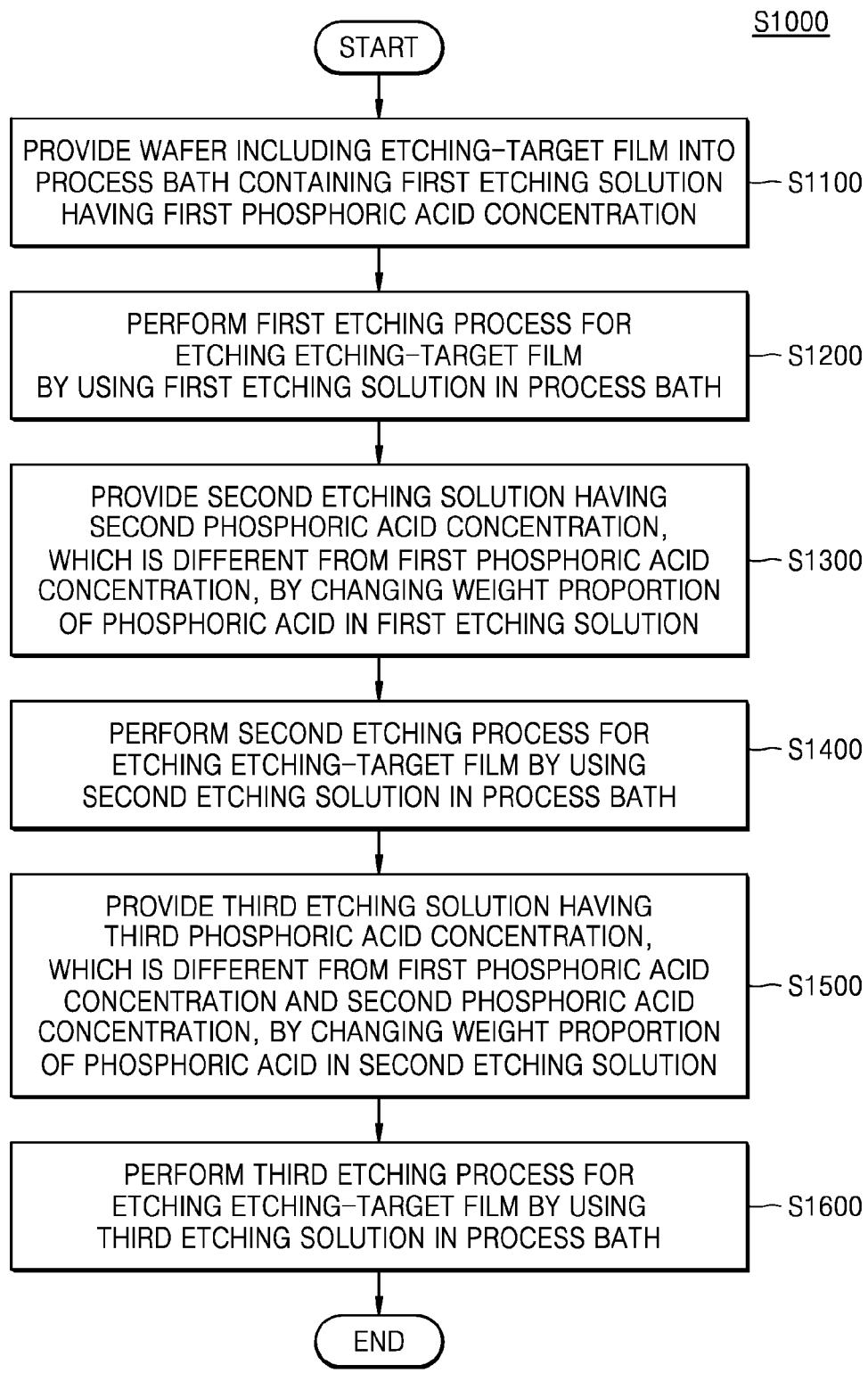
FIG. 2 is a flowchart illustrating a wet etching method according to an example embodiment of the inventive concept.

FIG. 2 is a flowchart illustrating a wet etching method according to an example embodiment of the inventive concept.

Referring to FIG. 2, a wet etching method S1000 may include providing a wafer including an etching target film into a process bath containing a first etching solution that has a first phosphoric acid concentration (S1100), performing a first etching process for etching the etching target film by using the first etching solution in the process bath (S1200), providing a second etching solution having a second phosphoric acid concentration, which is different from the first phosphoric acid concentration, by changing a phosphoric acid concentration in the first etching solution (S1300), performing a second etching process for etching the etching target film by using the second etching solution in the process bath (S1400), providing a third etching solution having a third phosphoric acid concentration, which is different from the first phosphoric acid concentration and the second phosphoric acid concentration, by changing a phosphoric acid concentration in the second etching solution (S1500), and performing a third etching process for etching the etching target film by using the third etching solution in the process bath.

Referring to FIGS. 1 and 2, in operation S1100, the wafer 150 may be provided into the process bath 111 containing the first etching solution having the first phosphoric acid concentration. The wafer 150 may include a structure, in which a plurality of insulating films and a plurality of sacrificial films are alternately layered one-by-one. In this case, the plurality of sacrificial films may correspond to the etching target film. A plurality of wafers 150 may be provided into the process bath 111. Each insulating film may include, for example, a silicon oxide film, and each sacrificial film may include, for example, a silicon nitride film. In an example embodiment, the first etching solution may include High Selectivity Nitride (HSN). In an example embodiment, the first phosphoric acid concentration may be selected from a range of about 90% by weight (wt %) to about 98 wt %.

In operation S1200, the first etching process, in which the etching target film is etched by using the first etching solution in the process bath 111, may be performed. The first etching process may be, for example, a wet etching process. The first etching process may be an etching process using a batch process. In an example embodiment, a temperature of the first etching process may be maintained in a range of about 160° C. to about 165° C. Accordingly, phosphoric acid included in the first etching solution may not evaporate. In an example embodiment, while the first etching process is performed, the first phosphoric acid concentration of the first etching solution may be maintained constant. For example, the first phosphoric acid concentration of the first etching solution may be 92 wt %, and while the first etching process is performed, the first phosphoric acid concentration may be maintained at 92 wt %.

In operation S1300, by changing a phosphoric acid concentration in the first etching solution, the second etching solution having the second phosphoric acid concentration, which is different from the first phosphoric acid concentration, may be provided. In an example embodiment, the second phosphoric acid concentration may be selected from a range of about 90 wt % to about 98 wt % and may be lower than the first phosphoric acid concentration. For example, the first phosphoric acid concentration may be 93 wt %, and the second phosphoric acid concentration may be 91 wt %. In an example embodiment, the first phosphoric acid concentration may be changed to the second phosphoric acid concentration by using water supplied at a first flow rate into the process bath 111 from the water-supply device 141. In an example embodiment, the phosphoric acid concentration in the first etching solution may be changed by as much as 1 wt % every time when a time period selected from a range of about 7 minutes to about 10 minutes elapses. For example, when the first phosphoric acid concentration is 92 wt % and the second phosphoric acid concentration is 90 wt %, the phosphoric acid concentration may be changed from the first phosphoric acid concentration to the second phosphoric acid concentration, after a certain time period selected from a range of about 14 minutes to about 20 minutes has passed.

In operation S1400, the second etching process, in which the etching target film is etched by using the second etching solution in the process bath 111, may be performed. The second etching process may be, for example, a wet etching process. The second etching process may be an etching process using a batch process. In an example embodiment, a temperature of the second etching process may be maintained in a range of about 160° C. to about 165° C. Accordingly, phosphoric acid included in the second etching solution may not evaporate. In an example embodiment, while the second etching process is performed, the second phosphoric acid concentration of the second etching solution may be maintained constant. For example, the second phosphoric acid concentration of the second etching solution may be 90 wt %, and while the second etching process is performed, the second phosphoric acid concentration may be maintained at 90 wt %. In an example embodiment, the second etching process may include a plurality of etching operations, and a phosphoric acid concentration in an etching solution used in each of the plurality of etching operations may gradually decrease as time passes. For example, the second etching process may include two etching operations sequentially performed, a phosphoric acid concentration in an etching solution used in a first etching operation may be 91 wt %, and a phosphoric acid concentration in an etching solution used in a second etching operation may be 90 wt %. In this case, there may be an operation of changing a phosphoric acid concentration of an etching solution between the first etching operation and the second etching operation, and the phosphoric acid concentration in the etching solution may be changed by as much as 1 wt % every time when a time period selected from a range of about 7 minutes to about 10 minutes elapses. When the second etching process includes a plurality of etching operations, a process temperature of each of the plurality of etching operations may be independently selected from a range of about 160° C. to about 165° C.

In operation S1500, by changing a phosphoric acid concentration in the second etching solution, the third etching solution having the third phosphoric acid concentration, which is different from the first phosphoric acid concentration and the second phosphoric acid concentration, may be provided. In an example embodiment, the third phosphoric acid concentration may be selected from a range of about 88 wt % to about 89 wt %. In an example embodiment, the second phosphoric acid concentration may be changed to the third phosphoric acid concentration by using water supplied at a second flow rate into the process bath 111 from the water-supply device 141. In this case, the second flow rate may be greater than the first flow rate set forth above in operation S1300. In an example embodiment, the phosphoric acid concentration in the second etching solution may be changed by as much as 1 wt % every time when a time period selected from a range of about 7 minutes to about 10 minutes elapses. For example, when the second phosphoric acid concentration is 90 wt % and the third phosphoric acid concentration is 88.8 wt %, the phosphoric acid concentration may be changed from the second phosphoric acid concentration to the third phosphoric acid concentration, after a certain time period selected from a range of about 8.4 minutes to about 12 minutes has passed.

In operation S1600, the third etching process, in which the etching target film is etched by using the third etching solution in the process bath 111, may be performed. The third etching process may be, for example, a wet etching process. The third etching process may be an etching process using a batch process. In an example embodiment, a temperature of the third etching process may be maintained in a range of about 160° C. to about 165° C. Accordingly, phosphoric acid included in the third etching solution may not evaporate. In an example embodiment, while the third etching process is performed, the third phosphoric acid concentration of the third etching solution may be maintained constant. For example, the third phosphoric acid concentration of the third etching solution may be 88.8 wt %, and while the third etching process is performed, the third phosphoric acid concentration may be maintained at 88.8 wt %. In an example embodiment, a total time period of the pre-etching process, the first main etching process, the second main etching process, and the post-etching process is a time period selected from a range of 100 minutes to 150 minutes.

When the insulating film includes an oxide film and the sacrificial film includes a nitride film, an etching reaction formula by an etching solution is as follows.

[Reaction Formula 1]

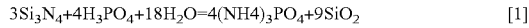

$$3Si_3N_4 + 4H_3PO_4 + 18H_2O = 4(NH_4)_3PO_4 + 9SiO_2 \quad [1]$$

$$SiO_2 + 4H^+ + 4e^- = Si + 2H_2O \quad [2]$$

Referring to Reaction Formula 1, when a water concentration in the etching solution decreases, an etching reaction of the sacrificial film decreases, and an etching reaction of the insulating film increases. Accordingly, an etch selectivity of the sacrificial film to the insulating film by the etching solution decreases. In the wet etching method according to an example embodiment of the inventive concept, the first phosphoric acid concentration is greater than the second phosphoric acid concentration, and the second phosphoric acid concentration is greater than the third phosphoric acid concentration. Accordingly, the first etching solution having the first phosphoric acid concentration has a lower etch selectivity of the sacrificial film to the insulating film than the second etching solution having the second phosphoric acid concentration, and the second etching solution having the second phosphoric acid concentration has a lower etch selectivity of the sacrificial film to the insulating film than the third etching solution having the third phosphoric acid concentration. For example, the etch selectivity of the sacrificial film to the insulating film by the first etching solution may be selected from a range of about 100 to about 150, the etch selectivity of the sacrificial film to the insulating film by the second etching solution may be selected from a range of about 150 to about 250, and the etch selectivity of the sacrificial film to the insulating film by the third etching solution may be selected from a range of about 500 to about 800.

In the first etching process, in which the etch selectivity of the sacrificial film to the insulating film is relatively low, the insulating film may be etched by as much as a relatively large amount while the sacrificial film is removed, and in the third etching process, in which the etch selectivity of the sacrificial film to the insulating film is relatively high, the insulating film may be etched by as much as a relatively small amount while the sacrificial film is removed. Accordingly, a vertical length (Z-direction distance) between adjacent insulating films stacked on the wafer 150 may gradually decrease away from a region, in which the first etching process is performed, toward a region, in which the third etching process is performed. In this way, a structural margin between the adjacent insulating films may be secured, and thus, the reliability of a semiconductor device fabricated by the wet etching method according to an example embodiment of the inventive concept may be improved.

Figure 3:
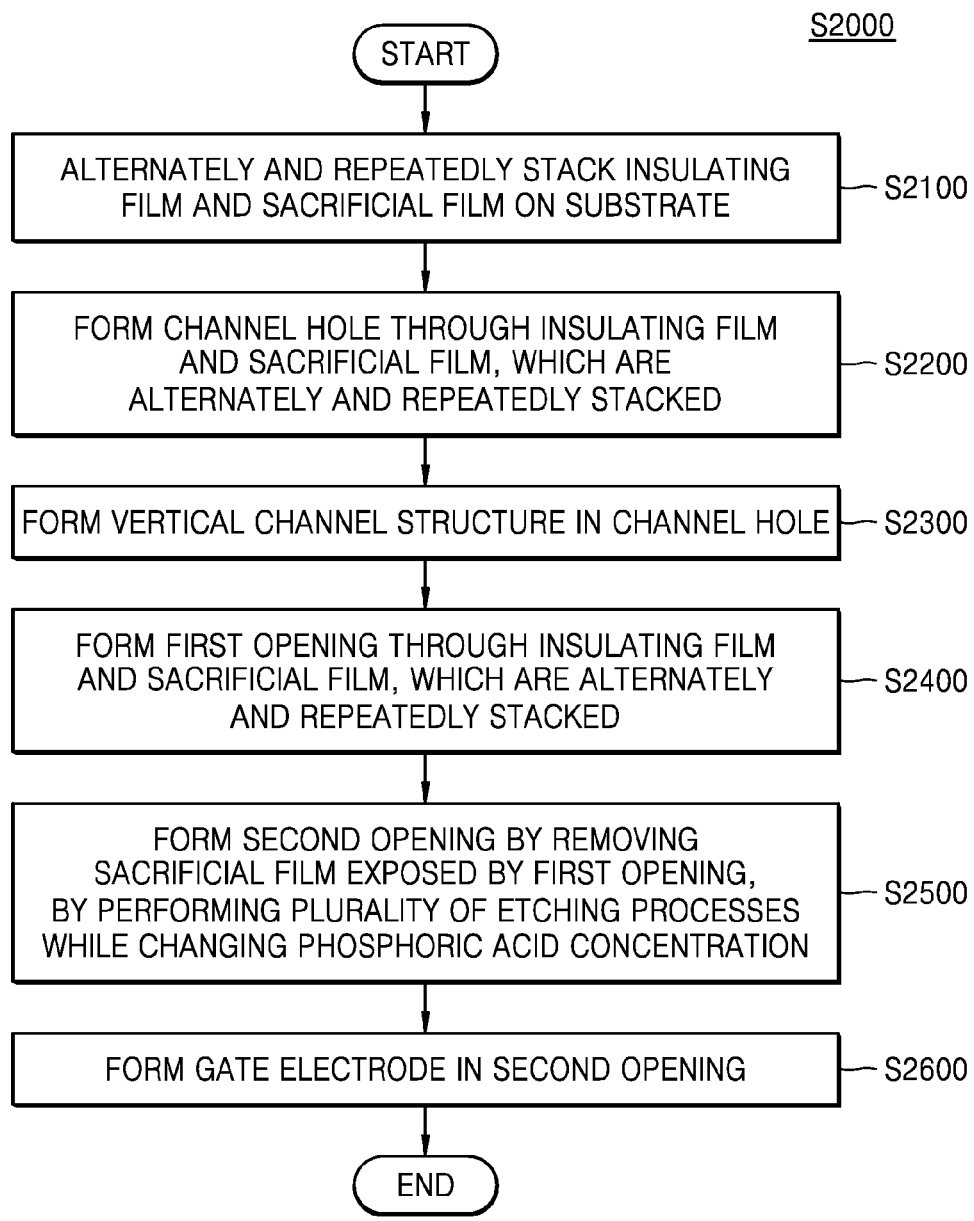
FIG. 3 is a flowchart illustrating a method of fabricating a semiconductor device, according to an example embodiment of the inventive concept.

FIG. 3 is a flowchart illustrating a method S2000 of fabricating a semiconductor device, according to an example embodiment of the inventive concept. FIGS. 4A to 4F are cross-sectional views illustrating respective operations of a method of fabricating a semiconductor device, according to an example embodiment of the inventive concept.

Figure 4A:
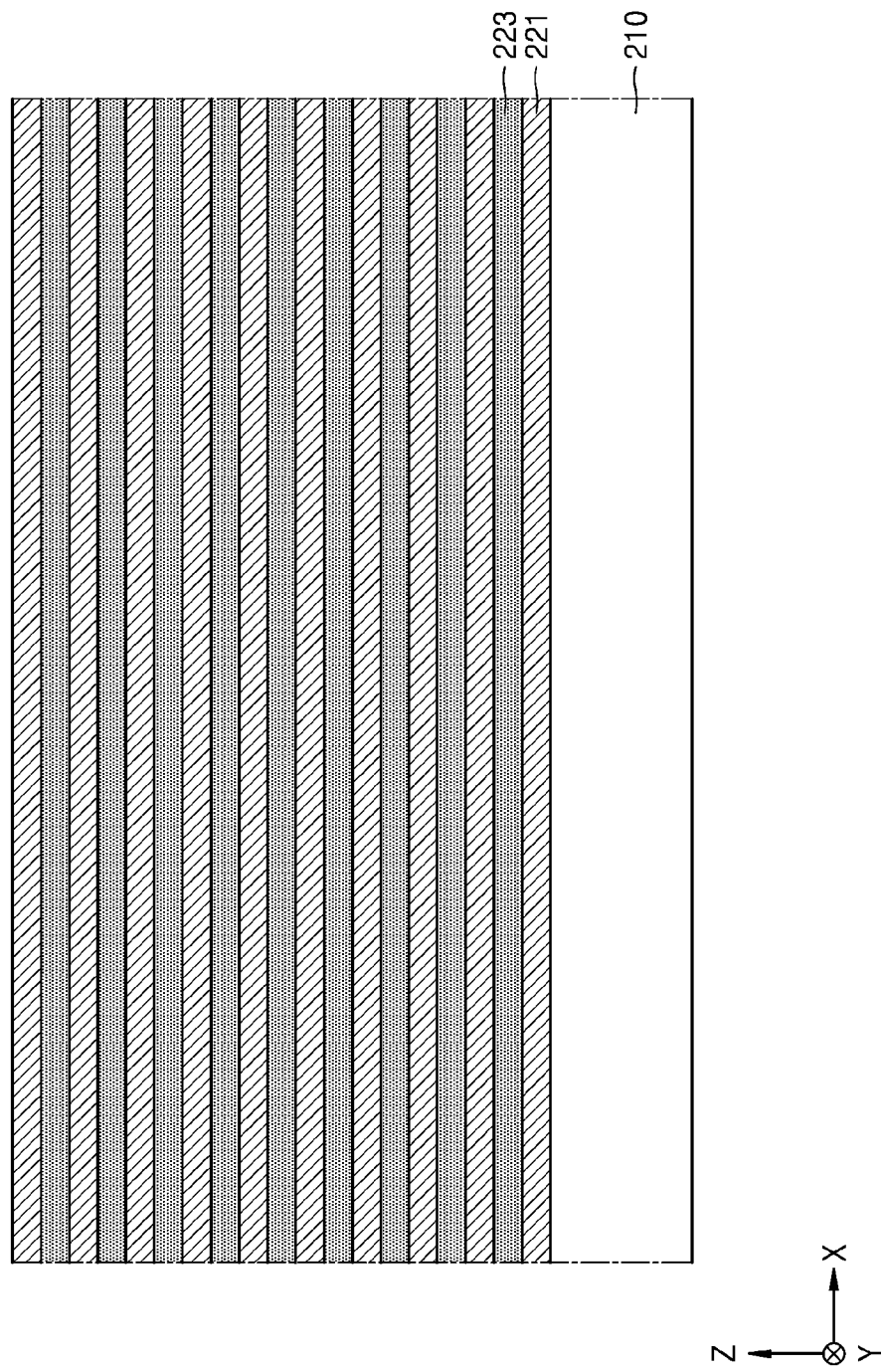
FIGS. 4A to 4F are cross-sectional views illustrating respective operations of a method of fabricating a semiconductor device, according to an example embodiment of the inventive concept.

Referring to FIGS. 3 and 4A, a plurality of insulating films 221 and a plurality of sacrificial films 223 may be alternately disposed one-by-one on the substrate 210 (S2100).

The substrate 210 may include Si, Ge, or SiGe. In an example embodiment, an insulating film 221 may include a silicon oxide film, and a sacrificial film 223 may include a silicon nitride film. Each of the insulating film 221 and the sacrificial film 223 may be stacked by a chemical vapor deposition (CVD) process, a plasma-enhanced CVD (PECVD) process, or an atomic layer deposition (ALD) process.

A structure, in which the plurality of insulating films 221 and the plurality of sacrificial films 223 are alternately stacked one-by-one, is needed to form a memory stack of a semiconductor device, and the plurality of sacrificial films 223 may respectively provide spaces for forming a plurality of word lines, which are included in the memory stack, in a subsequent process.

Figure 4B:
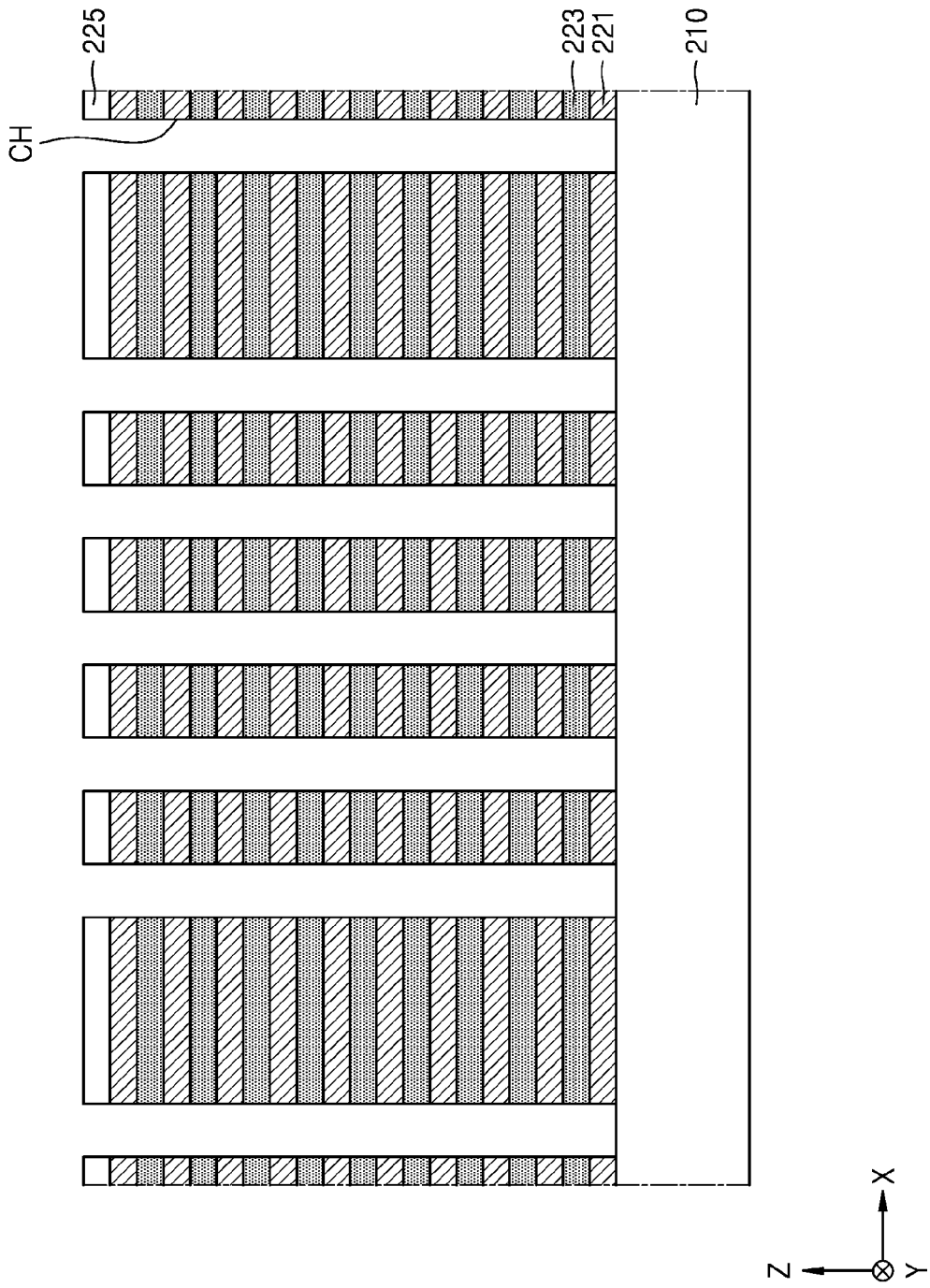

Referring to FIGS. 3 and 4B, an insulating pattern 225 may be formed on a resulting product of FIG. 4A, followed by etching the plurality of insulating films 221 and the plurality of sacrificial films 223 by using the insulating pattern 225 as an etch mask, thereby forming a channel hole CH (S2200). The channel hole CH may pass through the structure including the plurality of insulating films 221 and the plurality of sacrificial films 223 in the vertical direction (Z direction), and the substrate 210 may be exposed at a bottom of the channel hole CH. The insulating pattern 225 may include a single layer or a plurality of layers including an oxide film, a nitride film, or a combination thereof.

Figure 4C:
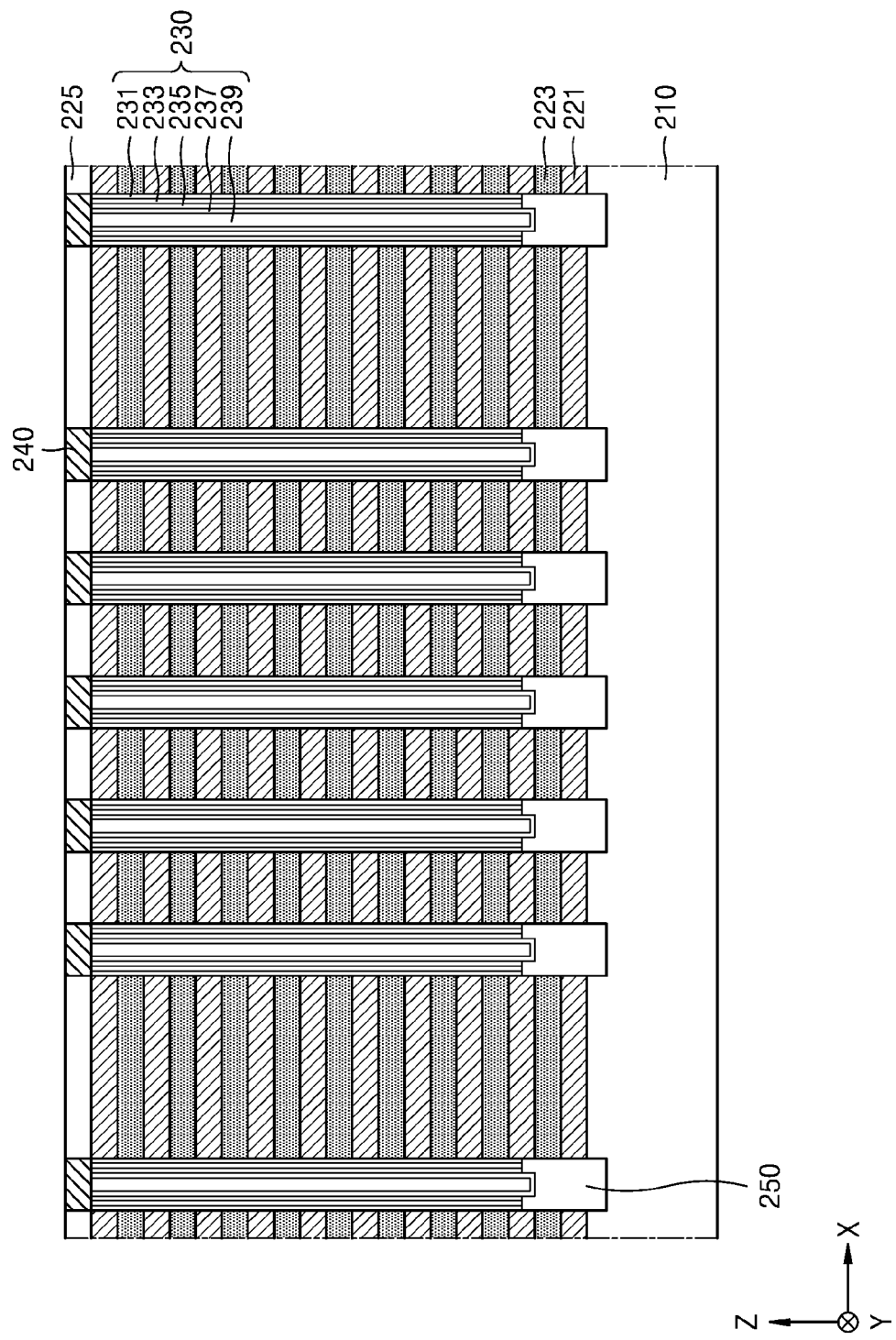

Referring to FIGS. 3 and 4C, a vertical channel structure 230 may be formed in the channel hole CH (S2300). Before the vertical channel structure 230 is formed, a semiconductor pattern 250 may be formed to partially fill the channel hole CH by performing a selective epitaxial growth process using, as a seed, the substrate 210 exposed at the bottom of the channel hole CH. The semiconductor pattern 250 may provide a channel region. In example embodiments, the semiconductor pattern 250 may include an impurity-doped semiconductor layer. For example, the semiconductor pattern 250 may include an impurity-doped Si layer.

The vertical channel structure 230 may include a blocking dielectric film 231, a charge trap film 233, a tunneling dielectric film 235, a channel layer 237, a gap-fill insulating film 239, and a drain region 240, which fills an entrance-side upper portion of the channel hole CH. In the channel hole CH, each of the blocking dielectric film 231, the charge trap film 233, the tunneling dielectric film 235, and the channel layer 237 may have a cylindrical shape.

The blocking dielectric film 231 may include silicon oxide, silicon nitride, or a metal oxide having permittivity that is greater than that of silicon oxide. The metal oxide may include hafnium oxide, aluminum oxide, zirconium oxide, tantalum oxide, or a combination thereof. The charge trap film 233 may include silicon nitride, boron nitride, silicon boron nitride, or impurity-doped polysilicon. The tunneling dielectric film 235 may include silicon oxide, hafnium oxide, aluminum oxide, zirconium oxide, tantalum oxide, or the like. The channel layer 237 may include doped polysilicon or undoped polysilicon. The buried insulating film 239 may include silicon oxide, silicon nitride, silicon oxynitride, or a combination thereof.

Although FIG. 4C illustrates an example in which the insulating pattern 225 remains around the drain region 240, the inventive concept is not limited thereto. For example, while the blocking dielectric film 231, the charge trap film 233, the tunneling dielectric film 235, the channel layer 237, and the buried insulating film 239 are formed in the channel hole CH, the insulating pattern 225 may be removed to expose an upper surface of an uppermost insulating film 221, followed by forming a new insulating film (not shown) to cover the upper surface of the uppermost insulating film 221. Next, a plurality of contact holes may be formed by etching regions of the insulating film, which correspond to respective channel holes CH, followed by forming the drain region 240 to fill each of the plurality of contact holes. The drain region 240 may include impurity-doped polysilicon, a metal, a conductive metal nitride, or a combination thereof. Examples of the metal constituting the drain region 240 may include, but are not limited to, tungsten, nickel, cobalt, tantalum, and the like.

Figure 4D:
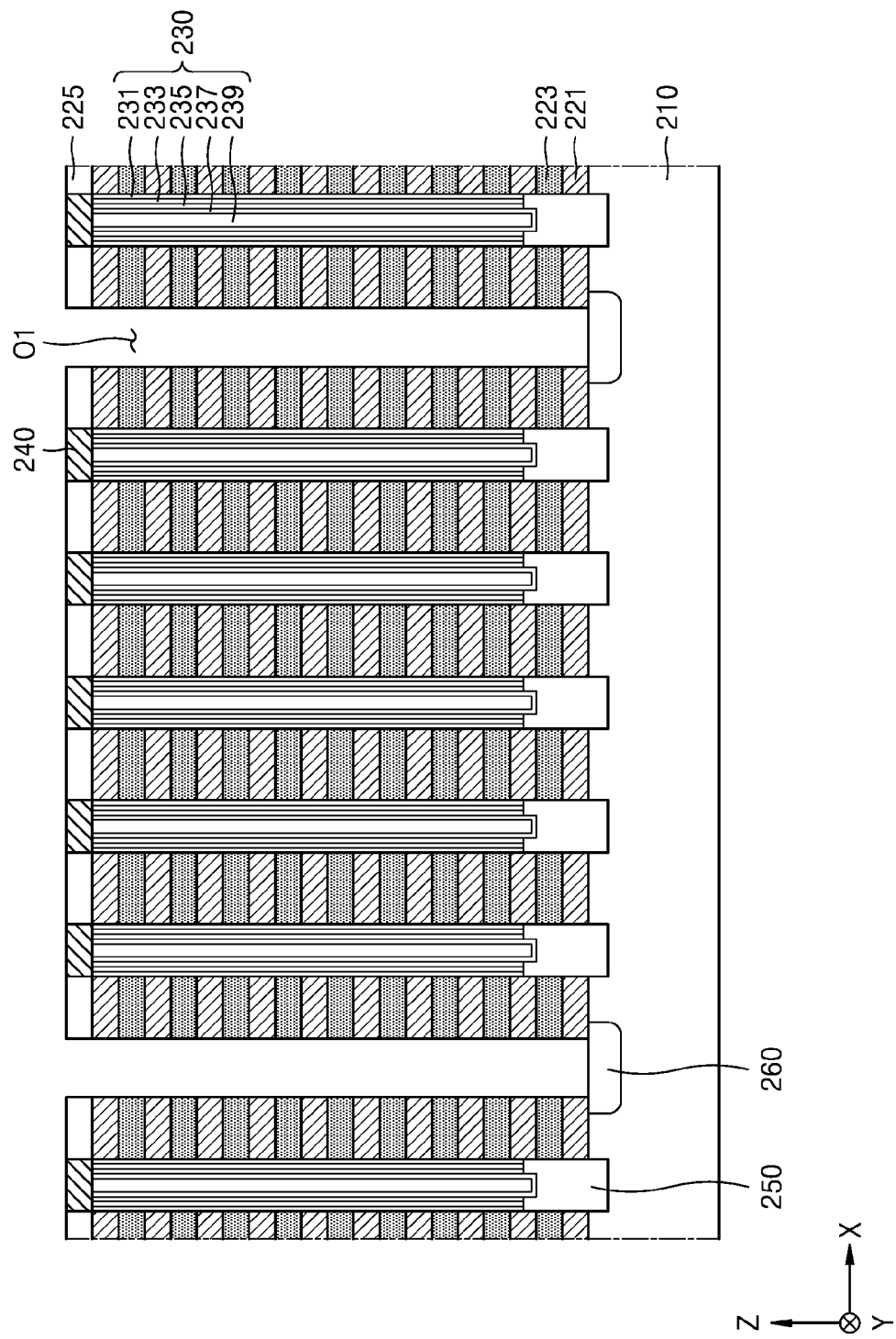

Referring to FIGS. 3 and 4D, a first opening O1 may be formed through the insulating pattern 225, the insulating films 221, and the sacrificial films 223 (S2400).

The first opening O1 may be formed by etching the insulating pattern 225, the insulating films 221, and the sacrificial films 223. The first opening O1 may expose the substrate 210. Next, a common source region 260 may be formed by implanting impurity ions into the substrate 210 exposed by the first opening O1.

The first opening O1 may pass through the structure including the insulating films 221 and the sacrificial films 223 in the vertical direction (Z direction) and extend in a line shape in the second horizontal direction (Y direction). The common source region 260 may be formed to extend in a line shape along the first opening O1.

Figure 4E:
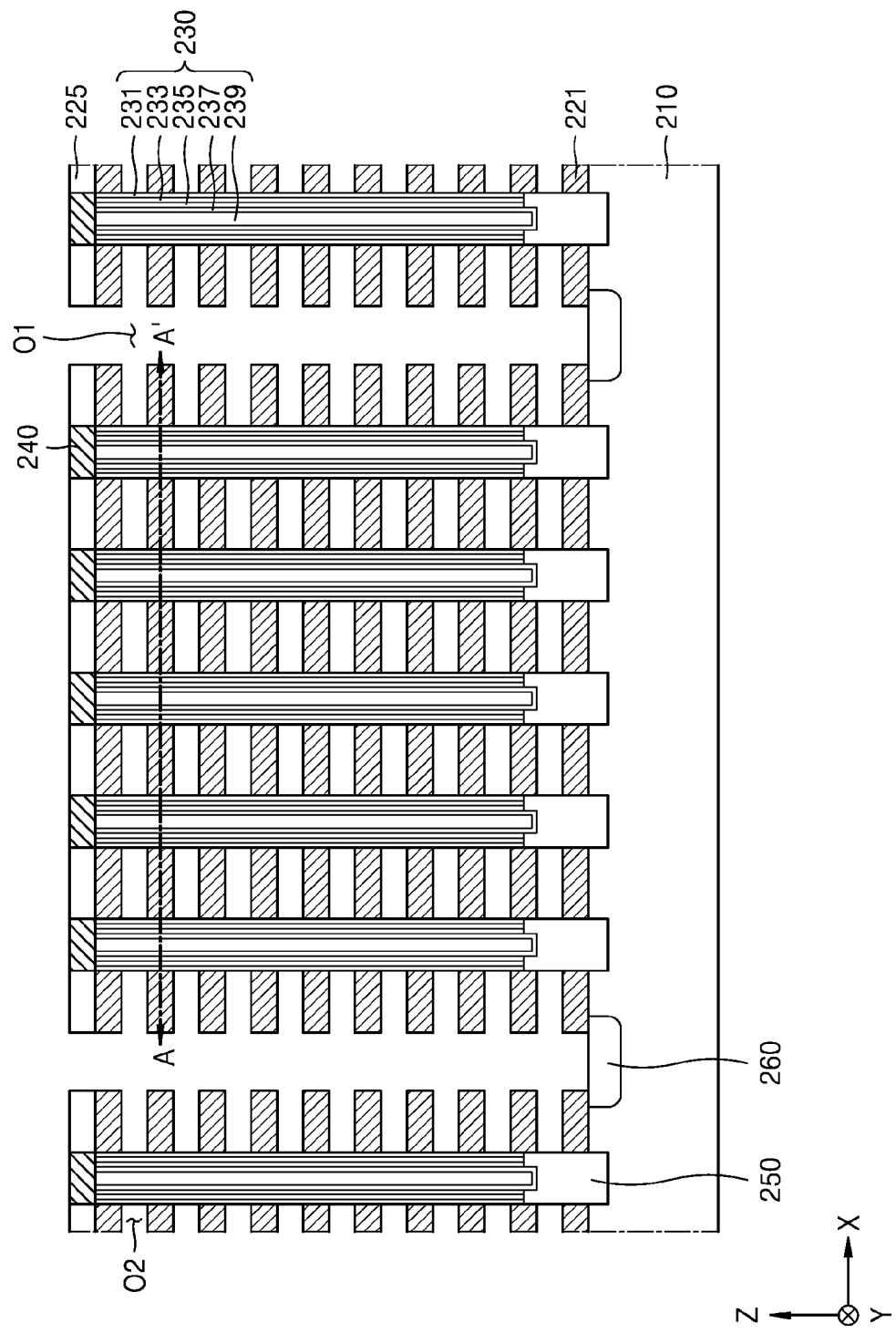

Referring to FIGS. 3 and 4E, by performing a plurality of etching processes while changing phosphoric acid concentrations of etching solutions, the sacrificial films 223 exposed by the first opening O1 may be removed, thereby forming a second opening O2 between each insulating film 221. The second openings O2 may overlap each other in a direction (Z direction) perpendicular to the upper surface of the substrate 210. The second opening O2 may be connected to the first opening O1. The blocking dielectric film 231 of the vertical channel structure 230 may be exposed by the second opening O2. The plurality of etching processes may be the same as the wet etching method described with reference to FIGS. 1 and 2. By changing a phosphoric acid concentration of an etching solution used in each etching process, etching solutions may respectively have different etch selectivities of a sacrificial film to an insulating film. Through the etching processes using the etching solutions having varying etch selectivities, a vertical length of the second opening O2 may be greater in a central region between adjacent first openings O1 than in a region adjacent to each first opening O1. Accordingly, in operation S2600, which will be described below, a structural margin for forming a gate electrode 227 (see FIG. 4F) may be secured, thereby improving the reliability of a semiconductor device. In addition, by increasing an etching rate of the insulating film through a change in the phosphoric acid concentration with the lapse of etching time, abnormal growth due to etching by-products, such as silicic acid, which is generated in an etching process of the sacrificial film 223 when the sacrificial film 223 includes silicon nitride, may be improved, thereby improving the productivity of a process of fabricating a semiconductor device.

Figure 4F:
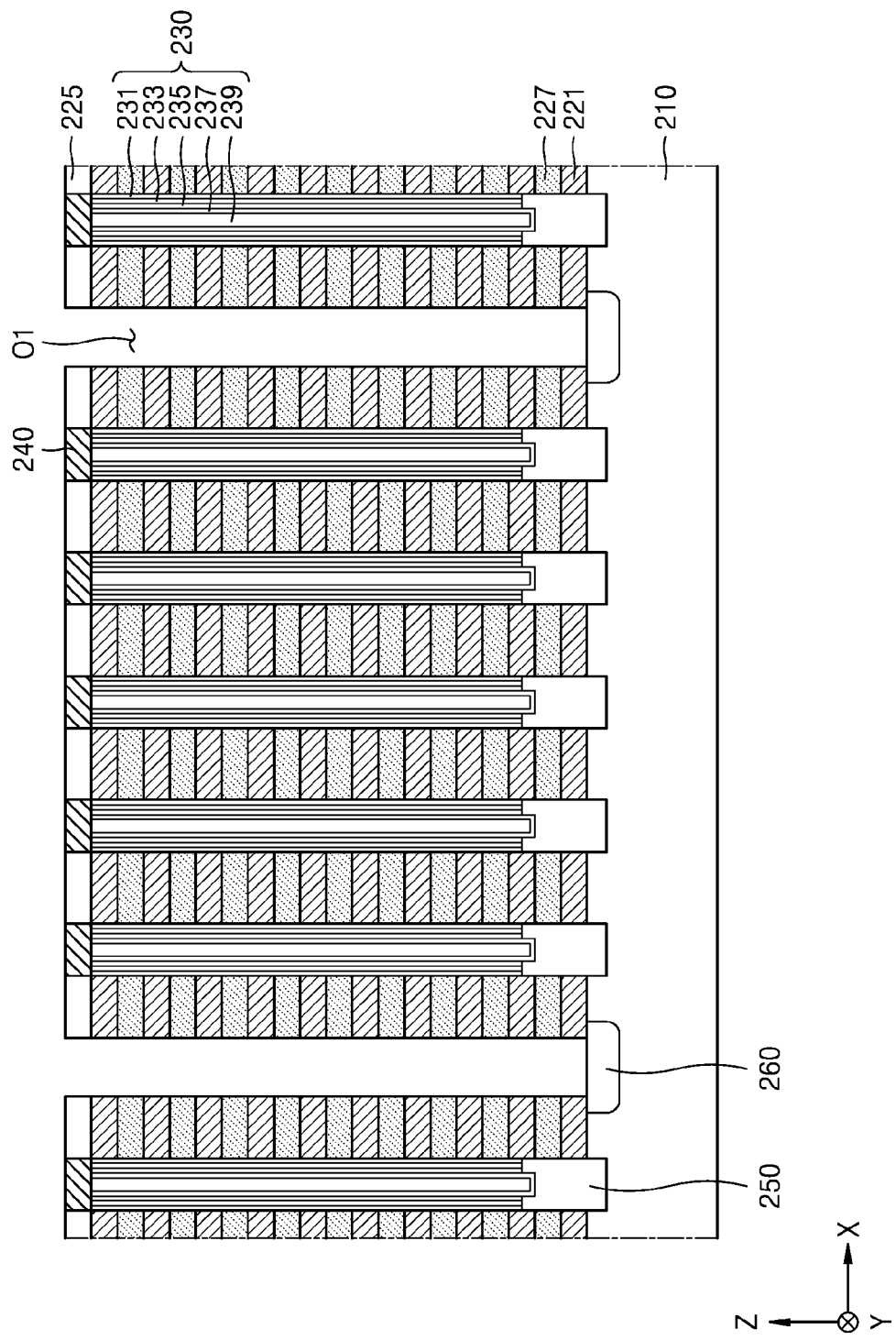

Referring to FIGS. 3 and 4F, the gate electrode 227 may be formed in the second opening O2 (S2600). The gate electrode 227 may include, for example, a metal, a metal silicide, a metal oxide, a metal nitride, polysilicon, conductive carbon, or a combination thereof. The metal may include, for example, tungsten. Although not shown in FIG. 4F, a dielectric thin film (not shown) may be formed between the gate electrode 227 and the insulating film 221 and between the gate electrode 227 and the vertical channel structure 230. The dielectric thin film may conformally cover a surface of each of the insulating film 221 and the vertical channel structure 230. The dielectric thin film may include a high-k film having a higher dielectric constant than silicon oxide. For example, the dielectric thin film may include an aluminum oxide film, a hafnium oxide film, a zirconium oxide film, or a tantalum oxide film. When the dielectric thin film is formed on the surface of each of the insulating film 221 and the vertical channel structure 230, the gate electrode 227 may be formed on the dielectric thin film to fill the remaining space of the second opening O2.

Figure 5:
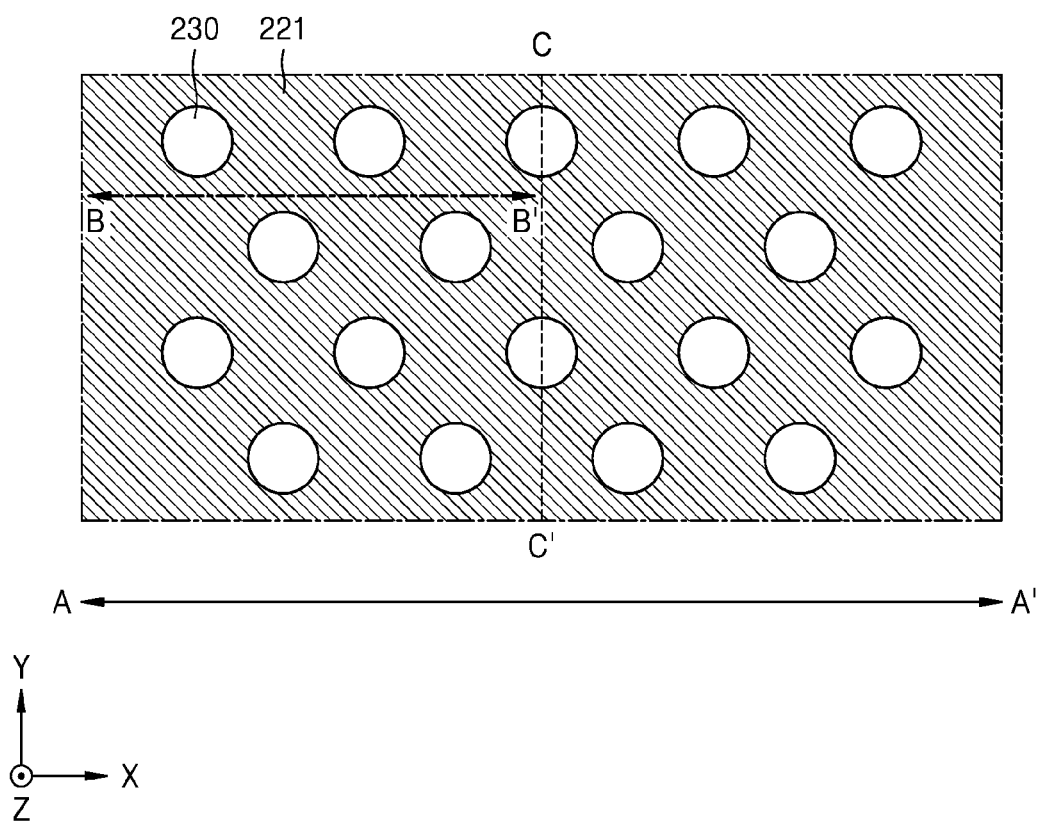
FIG. 5 is a cross-sectional view taken along a line A-A' of FIG. 4E on an X-Y plane.
Figure 6A:
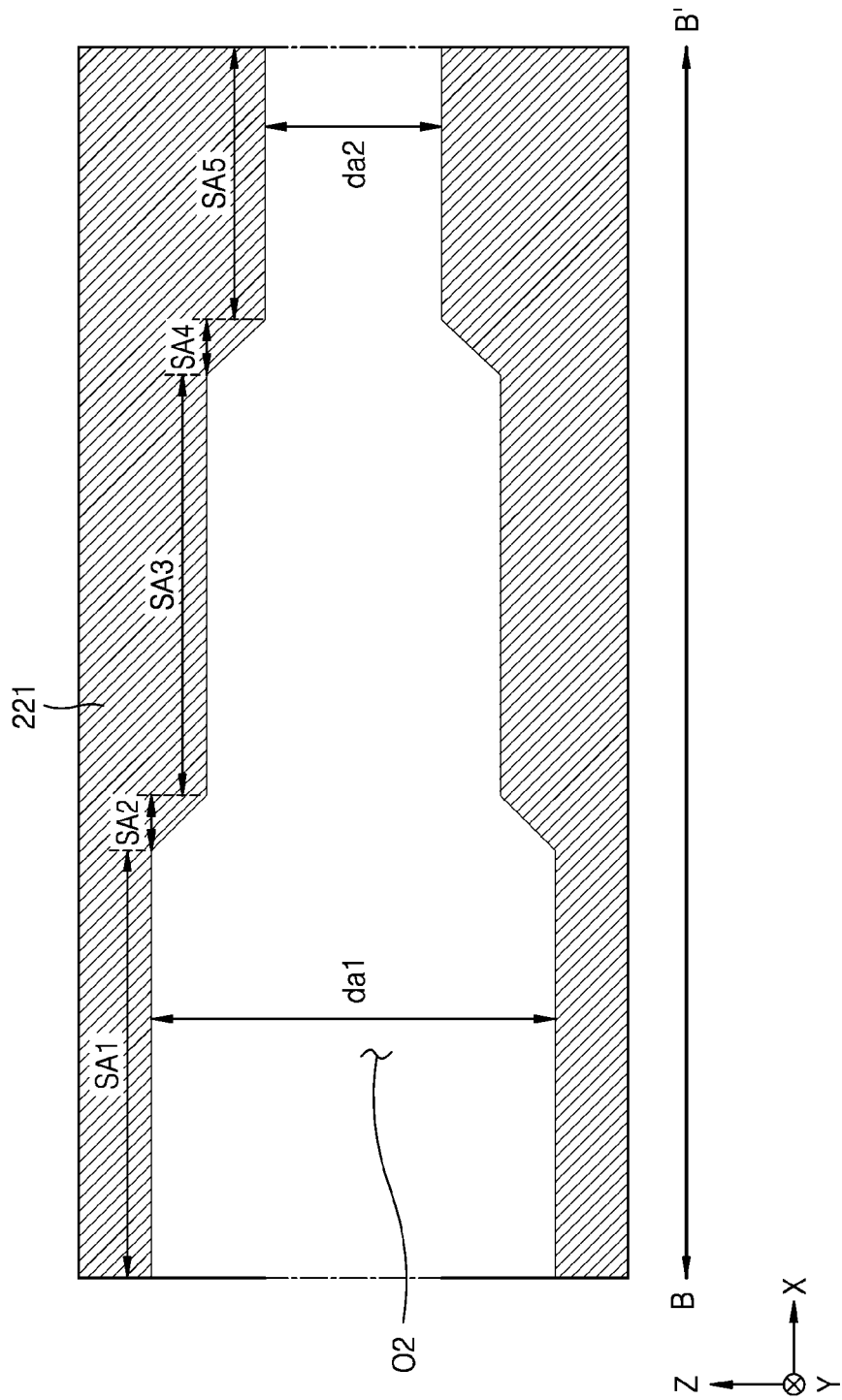

FIG. 5 is a cross-sectional view taken along a line A-A' of FIG. 4E on an X-Y plane. FIGS. 6A and 6B are cross-sectional views taken along a line B-B' of FIG. 5 on an X-Z plane.

Referring to FIG. 5, vertical channel structures 230 may be arranged apart from each other in the first horizontal direction (X direction) and the second horizontal direction (Y direction). The respective vertical channel structures 230 may be arranged to be line-symmetric about an imaginary central line C-C' between adjacent first openings O1 (see FIG. 4E). The insulating film 221 may surround a sidewall of each of the vertical channel structures 230.

While the wet etching method described with reference to FIGS. 1 and 2 is performed, etching solutions may respectively have increased etch selectivities of a sacrificial film to an insulating film by variously controlling phosphoric acid concentrations of the etching solutions in intended concentration ranges, and thus, a profile of the second opening O2 may be variously controlled.

Referring to FIG. 6A, the second opening O2 may have a first region SA1, a third region SA3, and a fifth region SA5, which respectively have constant vertical lengths, and have a second region SA2 and a fourth region SA4, which respectively have varying vertical lengths. The first region SA1 may be adjacent to the first opening O1 (see FIG. 4E), and the fifth region SA5 may be adjacent to a center between adjacent first openings O1. The first region SA1, the third region SA3, and the fifth region SA5 may be respectively formed by operations S1200, S1400, and S1600 described with reference to FIGS. 1 and 2, and the second region SA2 and the fourth region SA4 may be respectively formed by operations S1300 and S1500 described with reference to FIGS. 1 and 2. In the wet etching method according to an example embodiment of the inventive concept, a selectivity of a sacrificial film to an insulating film by an etching solution gradually increases in the order of the first etching solution, the second etching solution, and the third etching solution. Accordingly, while the sacrificial film 223 (see FIG. 4E) is etched, the insulating film 221 is relatively less etched in the fifth region SA5 than in the first region SA1. That is, a vertical length da1 of the first region SA1 is greater than a vertical length da2 of the fifth region SA5. In an example embodiment, a difference between the vertical length da1 of the first region SA1 and the vertical length da2 of the fifth region SA5 may be at least 7 Å. Greater differences between da1 and da2, such as at least 8 Å, or at least 10 Å, or even at least 12 Å are possible.

Referring to FIG. 6B, the second opening O2 may have a first region SB1, a third region SB3, a fifth region SB5, and a seventh region SB7, which respectively have constant vertical lengths, and have a second region SB2, a fourth region SB4, and a sixth region SB6, which respectively have varying vertical lengths. The first region SB1 may be adjacent to the first opening O1 (see FIG. 4E), and the seventh region SB7 may be adjacent to the center between the adjacent first openings O1. The first region SB1 may be formed by the first etching process described with reference to FIGS. 1 and 2, the third region SB3 and the fifth region SB5 may be formed by the second etching process including two etching operations, and the seventh region SB7 may be formed by the third etching process. The second region SB2, the fourth region SB4, and the sixth region SB6 may be formed during the process of changing phosphoric acid concentrations in the etching solutions used in the respective etching processes. Similar to the descriptions made with reference to FIG. 6A, due to selectivity differences between the etching solutions, the insulating film 221 is relatively less etched in the seventh region SB7 than in the first region SB1. Accordingly, a vertical length db1 of the first region SB1 is greater than a vertical length db2 of the seventh region SB7. In an example embodiment, a difference between the vertical length db1 of the first region SB1 and the vertical length db2 of the seventh region SB7 may be at least 7 Å.

Unlike the example shown in FIG. 6B, when the second etching process includes three or more etching operations, the second opening O2 may include more regions with constant vertical lengths and more regions with decreasing vertical lengths. For example, when the second etching process includes three etching operations, the second opening O2 may have a first region, a third region, a fifth region, a seventh region, and a ninth region, which respectively have constant vertical lengths, and have a second region, a fourth region, a sixth region, and an eighth region, which respectively have varying vertical lengths, through the first etching process, the three etching operations of the second etching process, and the third etching process. In this case, the vertical length of the second opening O2 in the first region may be greater than the vertical length of the second opening O2 in the ninth region. In an alternate example, the phosphoric acid concentration is changed gradually throughout most of or the entire etch to form a more inclined surface throughout the length of the etch instead of the 'stair-step' surface illustrated in FIGS. 6A and 6B.

Figure 7:
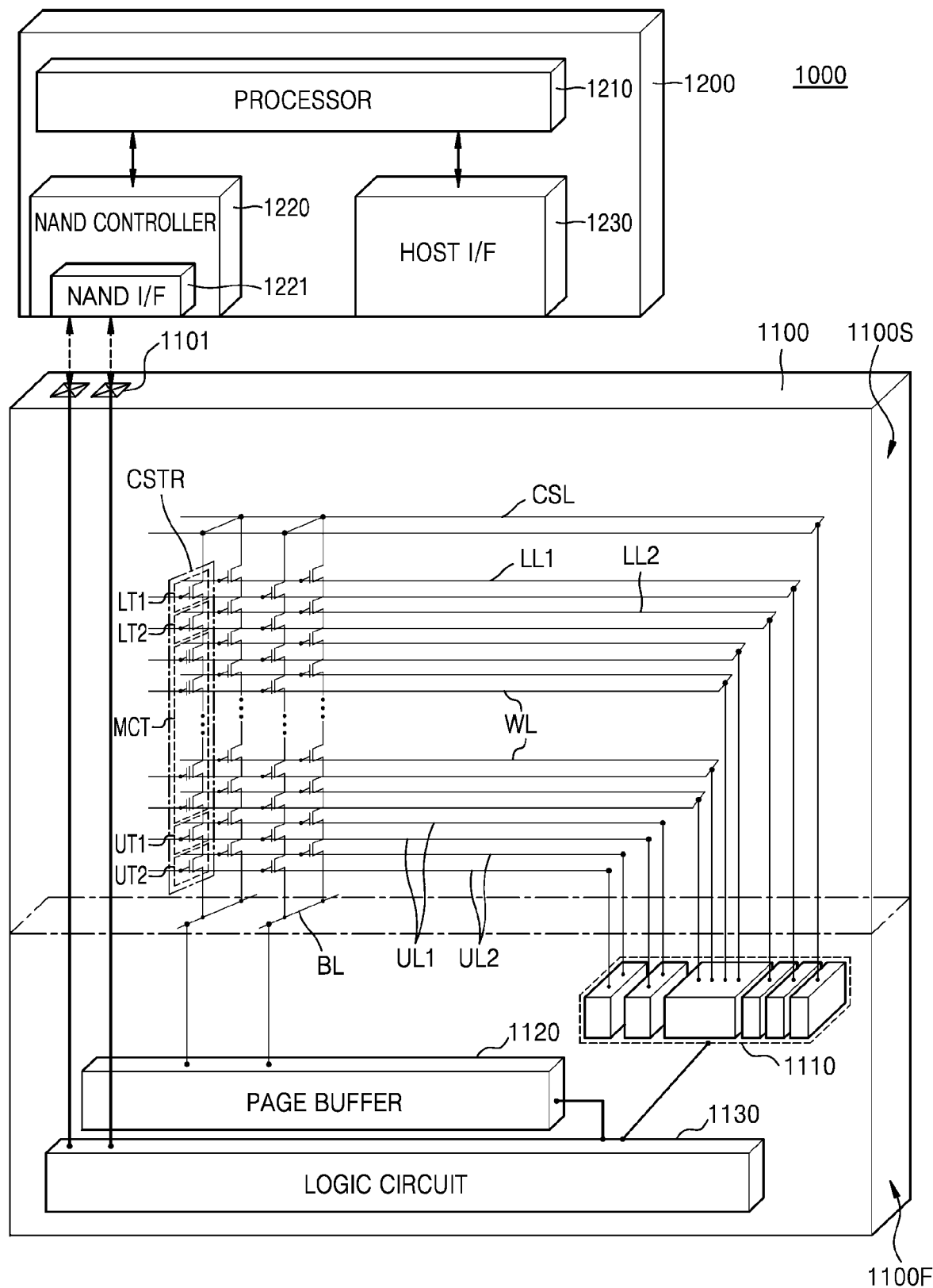
FIG. 7 is a diagram schematically illustrating a memory system including a semiconductor device, according to embodiments of the inventive concept.

FIG. 7 is a diagram schematically illustrating a memory system 1000 including a semiconductor device, according to embodiments of the inventive concept.

Referring to FIG. 7, the memory system 1000 may include at least one memory device 1100 and a memory controller 1200 electrically connected to the memory device 1100. The memory system 1000 may include a solid state drive (SSD) device, a universal serial bus (USB) system, a computing system, a medical device, or a communication device, which includes at least one memory device 1100.

The memory device 1100 may include a non-volatile memory device. For example, the memory device 1100 may include a NAND flash memory device fabricated by the wet etching method described with reference to FIGS. 1 and 2. The memory device 1100 may include a first structure 1100F and a second structure 1100S on the first structure 1100F.

The second structure 1100S may include a bit line BL, a common source line CSL, a plurality of word lines WL, first and second string select lines UL1 and UL2, first and second ground select lines LL1 and LL2, and a plurality of memory cell strings CSTR between the bit line BL and the common source line CSL. The vertical channel structure 230 and the gate electrode 227, which are shown in FIG. 4F, may form a memory cell string CSTR.

In the second structure 1100S, each of the plurality of memory cell strings CSTR may include ground select transistors LT1 and LT2 adjacent to the common source line CSL, string select transistors UT1 and UT2 adjacent to the bit line BL, and a plurality of memory cell transistors MCT arranged between the ground select transistors LT1 and LT2 and the string select transistors UT1 and UT2. The number of ground select transistors LT1 and LT2 and the number of string select transistors UT1 and UT2 may be variously modified according to embodiments. The vertical channel structure 230 and one of gate electrodes 227, which are shown in FIG. 4F, may form one of a plurality of transistors LT1, LT2, UT1, UT2, and MCT.

In example embodiments, a plurality of ground select lines LL1 and LL2 may be respectively connected to gate electrodes of ground select transistors LT1 and LT2. A word line WL may be connected to a gate electrode of a memory cell transistor MCT. A plurality of string select lines UL1 and UL2 may be respectively connected to gate electrodes of the string select transistors UT1 and UT2.

The common source line CSL, the plurality of ground select lines LL1 and LL2, the plurality of word lines WL, and the plurality of string select lines UL1 and UL2 may be connected to a row decoder 1110. A plurality of bit lines BL may be electrically connected to a page buffer 1120.

The memory device 1100 may communicate with the memory controller 1200 through an input-output pad 1101 electrically connected to a logic circuit 1130. The input-output pad 1101 may be electrically connected to the logic circuit 1130.

The memory controller 1200 may include a processor 1210, a NAND controller 1220, and a host interface 1230. In some embodiments, the memory system 1000 may include a plurality of memory devices 1100, and in this case, the memory controller 1200 may control the plurality of memory devices 1100.

The processor 1210 may take overall control of the memory system 1000 including the memory controller 1200. The processor 1210 may operate according to certain firmware and may access the memory device 1100 by controlling the NAND controller 1220. The NAND controller 1220 may include a NAND interface 1221, which performs communication with the memory device 1100. Through the NAND interface 1221, a control command for controlling the memory device 1100, data intended to be written to the plurality of memory cell transistors MCT of the memory device 1100, data intended to be read from the plurality of memory cell transistors MCT of the memory device 1100, and the like may be transmitted. The host interface 1230 may provide a communication function between the memory system 1000 and an external host. When a control command is received from the external host through the host interface 1230, the processor 1210 may control the memory device 1100 in response to the control command.

Figure 8:
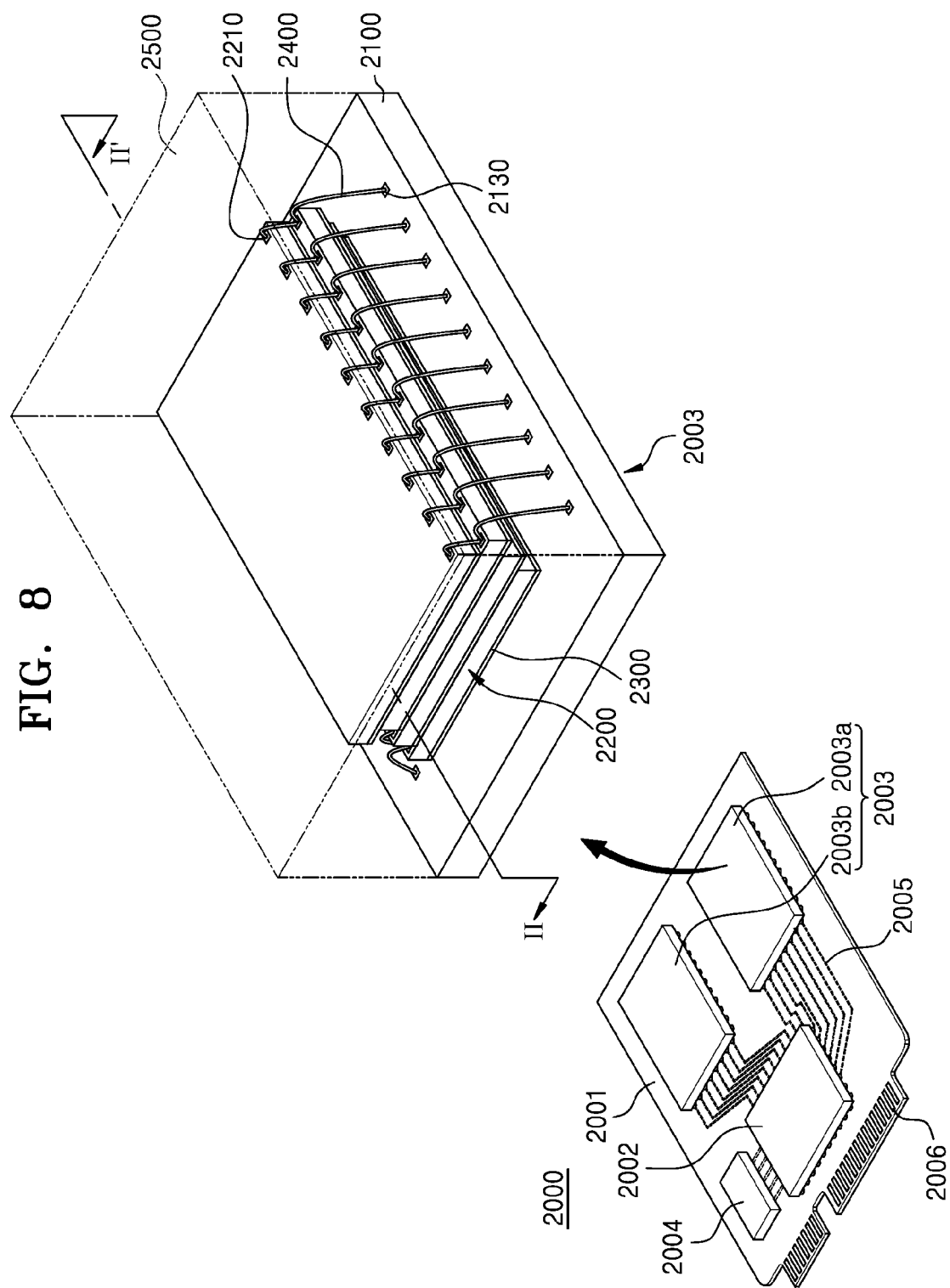
FIG. 8 is a perspective view schematically illustrating a memory system including a semiconductor device, according to embodiments of the inventive concept.

FIG. 8 is a perspective view schematically illustrating a memory system 2000 including a semiconductor device, according to embodiments of the inventive concept.

Referring to FIG. 8, the memory system 2000 according to an embodiment of the inventive concept may include a main substrate 2001, and a memory controller 2002, at least one semiconductor package 2003, and DRAM 2004, which are mounted on the main substrate 2001. The semiconductor package 2003 and the DRAM 2004 may be connected to the memory controller 2002 by a plurality of wiring patterns 2005 formed on the main substrate 2001.

The main substrate 2001 may include a connector 2006 including a plurality of pins coupled to an external host. The number and arrangement of pins in the connector 2006 may vary depending on a communication interface between the memory system 2000 and the external host. In example embodiments, the memory system 2000 may communicate with the external host according to one of interfaces, such as USB, Peripheral Component Interconnect Express (PCI-Express), Serial Advanced Technology Attachment (SATA), M-Phy for Universal Flash Storage (UFS), and the like. In example embodiments, the memory system 2000 may be operated by power supplied from the external host through the connector 2006. The memory system 2000 may further include a power management integrated circuit (PMIC) distributing the power, which is supplied from the external host, to the memory controller 2002 and the semiconductor package 2003.

The memory controller 2002 may write data to the semiconductor package 2003 or read data from the semiconductor package 2003 and may improve an operating speed of the memory system 2000.

The DRAM 2004 may be buffer memory for alleviating a difference in speed between the external host and the semiconductor package 2003, which is a data storage space. The DRAM 2004 included in the memory system 2000 may also operate as a type of cache memory and may provide a space for temporarily storing data in a control operation on the semiconductor package 2003. When the DRAM 2004 is included in the memory system 2000, the memory controller 2002 may further include a DRAM controller for controlling the DRAM 2004, in addition to a NAND controller for controlling the semiconductor package 2003.

The semiconductor package 2003 may include first and second semiconductor packages 2003a and 2003b, which are apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the plurality of semiconductor chips 2200 on the package substrate 2100, an adhesive layer 2300 on a lower surface of each of the plurality of semiconductor chips 2200, a connection structure 2400 electrically connecting the plurality of semiconductor chips 2200 to the package substrate 2100, and a molding layer 2500 arranged on the package substrate 2100 to cover the plurality of semiconductor chips 2200 and the connection structure 2400.

The package substrate 2100 may include a printed circuit board including a plurality of package upper pads 2130. Each of the plurality of semiconductor chips 2200 may include an input-output pad 2210. Each of the plurality of semiconductor chips 2200 may include a semiconductor device fabricated by using the wet etching method described with reference to FIGS. 1 and 2.

In example embodiments, the connection structure 2400 may include a bonding wire, which electrically connects the input-output pad 2210 to a package upper pad 2130. Accordingly, in the first and second semiconductor packages 2003a and 2003b, the plurality of semiconductor chips 2200 may be electrically connected to each other in a bonding-wire manner and may be electrically connected to the package upper pads 2130 of the package substrate 2100. In example embodiments, in the first and second semiconductor packages 2003a and 2003b, the plurality of semiconductor chips 2200 may be electrically connected to each other by a connection structure including a through-silicon via (TSV) rather than by the connection structure 2400 of a bonding wire type.

In example embodiments, the memory controller 2002 and the plurality of semiconductor chips 2200 may be included in one package. In example embodiments, the memory controller 2002 and the plurality of semiconductor chips 2200 may be mounted on a separate interposer substrate that is different from the main substrate 2001, and the memory controller 2002 may be connected to the plurality of semiconductor chips 2200 by wiring lines formed on the interposer substrate.

Figure 9:
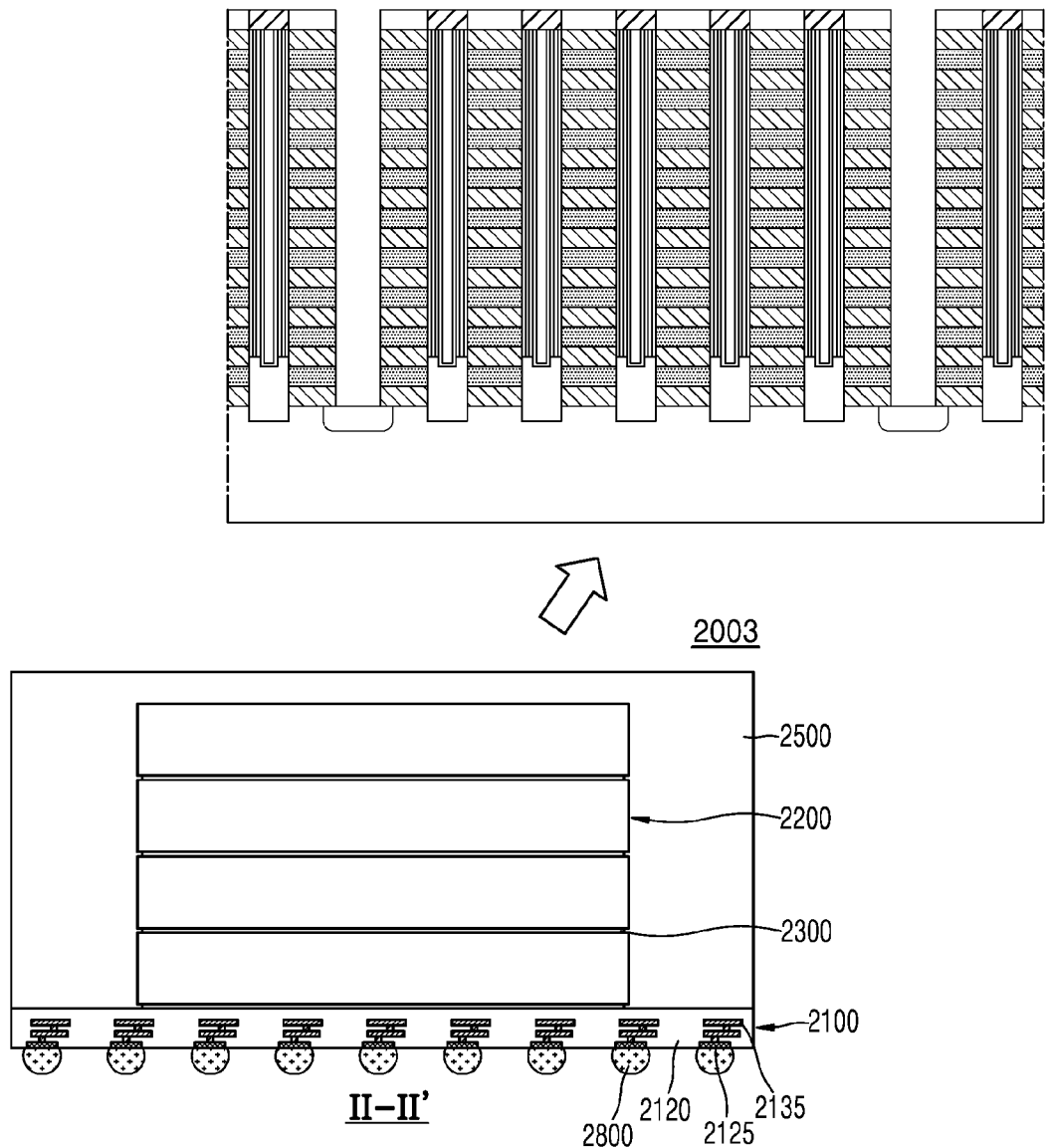
FIG. 9 is a cross-sectional view schematically illustrating semiconductor packages according to embodiments of the inventive concept.

FIG. 9 is a cross-sectional view schematically illustrating a semiconductor package 2003 according to embodiments of the inventive concept.

Referring to FIG. 9, in the semiconductor package 2003, the package substrate 2100 may include a printed circuit board. The package substrate 2100 may include a package substrate body 2120, the plurality of package upper pads 2130 (see FIG. 8) arranged on an upper surface of the package substrate body 2120, a plurality of lower pads 2125 arranged on or exposed by a lower surface of the package substrate body 2120, and a plurality of internal wiring lines 2135 arranged in the package substrate body 2120 to electrically connect the plurality of package upper pads 2130 (see FIG. 8) to the plurality of lower pads 2125. As shown in FIG. 8, the plurality of package upper pads 2130 may be electrically connected to the plurality of connection structures 2400, respectively. As shown in FIG. 9, the plurality of lower pads 2125 may be connected to the plurality of wiring patterns 2005 on the main substrate 2001 of the memory system 2000 shown in FIG. 8 through a plurality of conductive bumps 2800. Each of the plurality of semiconductor chips 2200 may include a semiconductor device fabricated by the wet etching method described with reference to FIGS. 1 and 2.

While the inventive concept has been particularly shown and described with reference to embodiments thereof, it will be understood that various changes in form and details may be made therein without departing from the spirit and scope of the following claims.

What is claimed is:

1. A wet etching method comprising:
providing a structure comprising an etching target film into a process bath containing a first etching solution that has a first phosphoric acid concentration;
performing a first etching process for etching the etching target film by using the first etching solution in the process bath;
providing a second etching solution having a second phosphoric acid concentration, which is different from the first phosphoric acid concentration, by changing a phosphoric acid concentration in the first etching solution;
performing a second etching process for etching the etching target film by using the second etching solution in the process bath;
providing a third etching solution having a third phosphoric acid concentration, which is different from the first phosphoric acid concentration and the second phosphoric acid concentration, by changing a phosphoric acid concentration in the second etching solution; and
performing a third etching process for etching the etching target film by using the third etching solution in the process bath.

2. The wet etching method of claim 1, wherein the first phosphoric acid concentration is selected from a range of about 90 wt % to about 98 wt %.

3. The wet etching method of claim 1, wherein each of the first phosphoric acid concentration and the second phosphoric acid concentration is selected from a range of about 90 wt % to about 98 wt %, and
the second phosphoric acid concentration is lower than the first phosphoric acid concentration.

4. The wet etching method of claim 1, wherein the third phosphoric acid concentration is selected from a range of about 88 wt % to about 89 wt %.

5. The wet etching method of claim 1, wherein the second etching process comprises a plurality of etching operations, and
wherein a change in phosphoric acid concentrations between respective etching solutions used in the plurality of etching operations comprises gradually decreasing phosphoric acid concentration over time.

6. The wet etching method of claim 1, wherein a process temperature of the first etching process, a process temperature of the second etching process, and a process temperature of the third etching process are each independently selected from a range of about 160° C. to about 165° C.

7. The wet etching method of claim 1, wherein a phosphoric acid concentration in the first etching solution during the first etching process and a phosphoric acid concentration in the second etching solution during the second etching process are each changed by 1 wt % or less for every time when a time period selected from a range of about 7 minutes to about 10 minutes elapses.

8. The wet etching method of claim 1, wherein a total time period of the first etching process, the second etching process, and the third etching process is from about 100 minutes to about 150 minutes.

9. The wet etching method of claim 1, wherein a phosphoric acid concentration in the first etching solution is maintained constant during the first etching process,
a phosphoric acid concentration in the second etching solution is maintained constant during the second etching process, and
a phosphoric acid concentration in the third etching solution is maintained constant during the third etching process.

10. The wet etching method of claim 1, further comprising:
after the performing of the first etching process, and before the performing of the second etching process, changing a phosphoric acid concentration in the first etching solution by using water at a first flow rate in the process bath; and
after the performing of the second etching process, and before the performing of the third etching process, changing a phosphoric acid concentration in the second etching solution by using water at a second flow rate in the process bath,
wherein the second flow rate is greater than the first flow rate.

11. A method of fabricating a semiconductor device, the method comprising:
forming a structure, in which a plurality of insulating films and a plurality of sacrificial films are alternately stacked one-by-one on a substrate;
forming a channel hole, which passes through the plurality of insulating films and the plurality of sacrificial films in a vertical direction;
forming a vertical channel structure in the channel hole;
forming a plurality of first openings, which pass through the plurality of insulating films and the plurality of sacrificial films in the vertical direction;
forming a plurality of second openings by removing the plurality of sacrificial films through each first opening; and
forming a plurality of gate electrodes in the plurality of second openings, respectively,
wherein the forming of the plurality of second openings by removing the plurality of sacrificial films comprises:
providing the structure into a process bath containing a first etching solution that has a first phosphoric acid concentration;
performing a first etching process for etching the plurality of sacrificial films by using the first etching solution in the process bath;
providing a second etching solution having a second phosphoric acid concentration, which is different from the first phosphoric acid concentration, by changing a phosphoric acid concentration in the first etching solution;
performing a second etching process for etching the plurality of sacrificial films by using the second etching solution in the process bath;
providing a third etching solution having a third phosphoric acid concentration, which is different from the first phosphoric acid concentration and the second phosphoric acid concentration, by changing a phosphoric acid concentration in the second etching solution; and
performing a third etching process for etching the plurality of sacrificial films by using the third etching solution in the process bath.

12. The method of claim 11, wherein a vertical length between adjacent insulating films in the structure gradually increases away from a center between adjacent first openings toward each first opening.

13. The method of claim 11, wherein a first vertical length between adjacent insulating films in a region adjacent to each first opening and a second vertical length between the adjacent insulating films in a region adjacent to a center between adjacent first openings have a difference of at least 7 Å therebetween.

14. The method of claim 11, wherein each of the first phosphoric acid concentration and the second phosphoric acid concentration is selected from a range of about 90 wt % to about 98 wt %,
the second phosphoric acid concentration is lower than the first phosphoric acid concentration, and
the third phosphoric acid concentration is selected from a range of about 88 wt % to about 89 wt %.

15. The method of claim 11, wherein a process temperature of the first etching process, a process temperature of the second etching process, and a process temperature of the third etching process are each independently selected from a range of about 160° C. to about 165° C.

16. A wet etching method comprising:
providing a structure comprising an oxide film and a nitride film into a process bath containing a first etching solution, which comprises water and phosphoric acid and has a first phosphoric acid concentration;
performing a pre-etching process for etching the oxide film and the nitride film by using the first etching solution;
providing a second etching solution having a second phosphoric acid concentration, which is different from the first phosphoric acid concentration, by reducing a phosphoric acid concentration in the first etching solution;
performing a first main etching process for etching the oxide film and the nitride film by using the second etching solution;
providing a third etching solution having a third phosphoric acid concentration, which is different from the first phosphoric acid concentration and the second phosphoric acid concentration, by reducing a phosphoric acid concentration in the second etching solution;

performing a second main etching process for etching the oxide film and the nitride film by using the third etching solution;

providing a fourth etching solution having a fourth phosphoric acid concentration, which is different from the first phosphoric acid concentration, the second phosphoric acid concentration, and the third phosphoric acid concentration, by reducing a phosphoric acid concentration in the third etching solution; and performing a post-etching process for etching the oxide film and the nitride film by using the fourth etching solution.

17. The wet etching method of claim 16, wherein each of the pre-etching process, the first main etching process, the second main etching process, and the post-etching process is performed for a time period selected from a range of about 100 minutes to about 150 minutes.

18. The wet etching method of claim 16, wherein the pre-etching process is performed for a longer time than the first main etching process.

19. The wet etching method of claim 16, wherein the first phosphoric acid concentration is selected from a range of about 91 wt % to about 92 wt %, each of the second phosphoric acid concentration and the third phosphoric acid concentration is selected from a range of about 90 wt % to about 91 wt %, the fourth phosphoric acid concentration is selected from a range of about 88 wt % to about 89 wt %, and the second phosphoric acid concentration is higher than the third phosphoric acid concentration.

20. The wet etching method of claim 16, wherein a process temperature of the pre-etching process, a process temperature of the first main etching process, a process temperature of the second main etching process, and a process temperature of the post-etching process are each independently selected from a range of about 160° C. to about 165° C.

* * * * *